US006780339B2

(12) United States Patent
Anagnostopoulos et al.

(10) Patent No.: US 6,780,339 B2
(45) Date of Patent: Aug. 24, 2004

(54) CMOS/MEMS INTEGRATED INK JET PRINT HEAD WITH OXIDE BASED LATERAL FLOW NOZZLE ARCHITECTURE AND METHOD OF FORMING SAME

(75) Inventors: Constantine N. Anagnostopoulos, Mendon, NY (US); John A. Lebens, Rush, NY (US); Christopher N. Delametter, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 352 days.

(21) Appl. No.: 10/025,363

(22) Filed: Dec. 19, 2001

(65) Prior Publication Data

US 2002/0101486 A1 Aug. 1, 2002

Related U.S. Application Data

(62) Division of application No. 09/751,593, filed on Dec. 29, 2000, now Pat. No. 6,382,782.

(51) Int. Cl.$^{7}$ ........................ G01D 15/00; G11B 5/127; H01L 21/00

(52) U.S. Cl. ........................................... 216/27; 438/21

(58) Field of Search .......................... 216/27; 29/890.1; 438/21; 347/20, 29, 40, 44, 47, 54–56, 63–65, 67, 73–75, 82

(56) References Cited

U.S. PATENT DOCUMENTS

| | | | |
|---|---|---|---|
| 1,941,001 | A | 12/1933 | Hansell |
| 3,373,437 | A | 3/1968 | Sweet et al. |
| 3,416,153 | A | 12/1968 | Hertz et al. |
| 3,946,398 | A | 3/1976 | Kyser et al. |
| 4,346,387 | A | 8/1982 | Hertz |
| 5,481,284 | A | 1/1996 | Kitahara et al. |
| 5,825,385 | A | 10/1998 | Silverbrook |
| 5,880,759 | A | 3/1999 | Silverbrook |
| 5,966,154 | A | 10/1999 | DeBoer |
| 6,079,821 | A | 6/2000 | Chwalek et al. |
| 6,213,595 | B1 | 4/2001 | Anagnostopoulos et al. |
| 6,217,163 | B1 | 4/2001 | Anagnostopoulos et al. |

FOREIGN PATENT DOCUMENTS

| | | | |
|---|---|---|---|
| EP | 0 805 036 | A2 | 11/1997 |
| EP | 1 110 732 | A2 | 12/2000 |
| GB | 2 007 162 | A | 10/1978 |
| JP | 6-183029 | A | 7/1994 |

OTHER PUBLICATIONS

"The CMOS Integrated Ink Jet Print Heads" by Constantine N. Anagnostopoulos, Eastman Kodak Company (Apr. 4, 2000).

(List continued on next page.)

*Primary Examiner*—Gregory Mills
*Assistant Examiner*—Roberts Culbert
(74) *Attorney, Agent, or Firm*—Norman Rushefsky

(57) ABSTRACT

A continuous ink jet print head is formed using a combination of traditional CMOS technology to form the various controlling electrical circuits on a silicon substrate having insulating layer(s) which provide electrical connections and a MEMS technology for forming nozzle openings. A blocking structure is formed in the insulating layer(s) between a first ink channel formed in the silicon substrate and a second ink channel formed in the insulating layer(s). The blocking structure causes ink to flow around the blocking structure and thereby develop lateral flow components to the liquid entering the second channel so that, for droplets selected for printing, as the stream of droplets emanates from the bore of the nozzle, there is provided a reduced amount of heat needed for operating a heating element adjacent each nozzle opening.

12 Claims, 17 Drawing Sheets

OTHER PUBLICATIONS

"Fabrication and Reliability Testing of Ti/TiN Heaters" by P. De Moor et al, Proceeding of SPIE, vol. 3874, on Micromachining and Microfabrication Process Technology V, Chairs/Editors: James H. Smith and Jean–Michel Karam, published Aug. 1999.

U.S. patent application No. 09/751,593, filed Dec. 29, 2000 and entitled: CMOS/MEMS Integrated Ink Jet Print Head with Oxide Based Lateral Flow Nozzle Architecture and Method of Forming Same in the name of C. N. Anagnostopoulos et al.

U.S. patent application No. 09/751,115, filed Dec. 29, 2000 and entitled: Incorporation of Supplementary Heaters in the Ink Channels of CMOS/MEMS Integrated Ink Jet Print Head and Method of Forming Same in the name of C. N. Anagnostpopoulos et al.

U.S. patent application No. 09751,726, filed Dec. 29, 2000 and entitled: Incorporation of Silicon Bridges in the Ink Channels of CMOS/MEMS Integrated Ink Jet Print Heads, in the name of C. N. Anagnostpopoulos et al.

U.S. patent application No. 09/751,722, filed Dec. 29, 2000 and entitled: CMOS/MEMS Integrated Ink Jet Print Head with Silicon Based Lateral Flow Nozzle Architecture and Method of Forming Same, in the name of C. N. Anagnostopoulos et al.

U.S. patent application No. 09/731,355, filed Dec. 6, 2000 and entitled: Improved page Wide Ink Jet Printing, in the name of C. N. Anagnostopoulos et al.

CM OS/MEMS INTEGRATED INK JET PRINT HEAD WITH OXIDE BASED LATERAL FLOW NOZZLE ARCHITECTURE AND METHOD OF FORMING SAME

CROSS REFERENCE TO RELATED APPLICATION

Reference is made to division from U.S. application Ser. No. 09/751,593, filed Dec. 29, 2000 now U.S. Pat. No. 6,382,782 entitled. CMOS/MEMS INTEGRATED INK JET PRINT HEAD WITH OXIDE BASED LATERAL FLOW NOZZLE ARCHITECTURE AND METHOD OF FORMING SAME

FIELD OF THE INVENTION

This invention generally relates to the field of digitally controlled printing devices, and in particular to liquid ink print heads which integrate multiple nozzles on a single substrate and in which a liquid drop is selected for printing by thermo-mechanical means.

BACKGROUND OF THE INVENTION

Ink jet printing has become recognized as a prominent contender in the digitally controlled, electronic printing arena because, e.g., of its non-impact, low noise characteristics and system simplicity. For these reasons, ink jet printers have achieved commercial success for home and office use and other areas.

Ink jet printing mechanisms can be categorized as either continuous (CIJ) or Drop-on-Demand (DOD). U.S. Pat. No. 3,946,398, which issued to Kyser et al. in 1970, discloses a DOD ink jet printer which applies a high voltage to a piezoelectric crystal, causing the crystal to bend, applying pressure on an ink reservoir and jetting drops on demand. Piezoelectric DOD printers have achieved commercial success at image resolutions greater than 720 dpi for home and office printers. However, piezoelectric printing mechanisms usually require complex high voltage drive circuitry and bulky piezoelectric crystal arrays, which are disadvantageous in regard to number of nozzles per unit length of print head, as well as the length of the print head. Typically, piezoelectric print heads contain at most a few hundred nozzles.

Great Britain Patent No. 2,007,162, which issued to Endo et al., in 1979, discloses an electrothermal drop-on-demand ink jet printer that applies a power pulse to a heater which is in thermal contact with water based ink in a nozzle. A small quantity of ink rapidly evaporates, forming a bubble, which causes a drop of ink to be ejected from small apertures along an edge of a heater substrate. This technology is known as thermal ink jet or bubble jet.

Thermal ink jet printing typically requires that the heater generates an energy impulse enough to heat the ink to a temperature near 400° C. which causes a rapid formation of a bubble. The high temperatures needed with this device necessitate the use of special inks, complicates driver electronics, and precipitates deterioration of heater elements through cavitation and kogation. Kogation is the accumulation of ink combustion by-products that encrust the heater with debris. Such encrusted debris interferes with the thermal efficiency of the heater and thus shorten the operational life of the print head. And, the high active power consumption of each heater prevents the manufacture of low cost, high speed and page wide print heads.

Continuous ink jet printing itself dates back to at least 1929. See U.S. Pat. No. 1,941,001 which issued to Hansell that year.

U.S. Pat. No. 3,373,437 which issued to Sweet et al. in March 1968, discloses an array of continuous ink jet nozzles wherein ink drops to be printed are selectively charged and deflected towards the recording medium. This technique is known as binary deflection continuous ink jet printing, and is used by several manufacturers, including Elmjet and Scitex.

U.S. Pat. No. 3,416,153, issued to Hertz et al. in December 1968. This patent discloses a method of achieving variable optical density of printed spots, in continuous ink jet printing. The electrostatic dispersion of a charged drop stream serves to modulate the number of droplets which pass through a small aperture. This technique is used in ink jet printers manufactured by Iris.

U.S. Pat. No. 4,346,387, entitled METHOD AND APPARATUS FOR CONTROLLING THE ELECTRIC CHARGE ON DROPLETS AND INK JET RECORDER INCORPORATING THE SAME issued in the name of Carl H. Hertz on Aug. 24, 1982. This patent discloses a CIJ system for controlling the electrostatic charge on droplets. The droplets are formed by breaking up of a pressurized liquid stream, at a drop formation point located within an electrostatic charging tunnel, having an electrical field. Drop formation is effected at a point in the electrical field corresponding to whatever predetermined charge is desired. In addition to charging tunnels, deflection plates are used to actually deflect the drops. The Hertz system requires that the droplets produced be charged and then deflected into a gutter or onto the printing medium. The charging and deflection mechanisms are bulky and severely limit the number of nozzles per print head.

Until recently, conventional continuous ink jet techniques all utilized, in one form or another, electrostatic charging tunnels that were placed close to the point where the drops are formed in the stream. In the tunnels, individual drops may be charged selectively. The selected drops are charged and deflected downstream by the presence of deflector plates that have a large potential difference between them. A gutter (sometimes referred to as a "catcher") is normally used to intercept the charged drops and establish a non-print mode, while the uncharged drops are free to strike the recording medium in a print mode as the ink stream is thereby deflected, between the "non-print" mode and the "print" mode.

Recently, a novel continuous ink jet printer system has been developed which renders the above-described electrostatic charging tunnels unnecessary. Additionally, it serves to better couple the functions of (1) droplet formation and (2) droplet deflection. That system is disclosed in the commonly assigned U.S. Pat. No. 6,079,821 entitled CONTINUOUS INK JET PRINTER WITH ASYMMETRIC HEATING DROP DEFLECTION filed in the names of James Chwalek, Dave Jeanmaire and Constantine Anagnostopoulos, the contents of which are incorporated herein by reference. This patent discloses an apparatus for controlling ink in a continuous ink jet printer. The apparatus comprises an ink delivery channel, a source of pressurized ink in communication with the ink delivery channel, and a nozzle having a bore which opens into the ink delivery channel, from which a continuous stream of ink flows. Periodic application of week heat pulses to the stream by a heater causes the ink stream to break up into a plurality of droplets synchronously with the applied heat pulses and at a position spaced from the nozzle. The droplets are deflected by increased heat pulses from the heater (in the nozzle bore) which heater has a selectively actuated section, i.e., the section associated with only a portion of the nozzle bore. Selective actuation of a particular heater section, constitutes what has been termed an asymmetrical application of heat to the stream. Alternating the sections can, in turn, alternate the direction in which this asymmetrical heat is supplied and serves to thereby deflect ink drops, inter alia, between a “print” direction (onto a recording medium) and a “non-print” direction (back into a “catcher”). The patent of Chwalek et al. thus provides a liquid printing system that affords significant improvements toward overcoming the prior art problems associated with the number of nozzles per print head, print head length, power usage and characteristics of useful inks.

Asymmetrically applied heat results in stream deflection, the magnitude of which depends upon several factors, e.g. the geometric and thermal properties of the nozzles, the quantity of applied heat, the pressure applied to, and the physical, chemical and thermal properties of the ink. Although solvent-based (particularly alcohol-based) inks have quite good deflection patterns, and achieve high image quality in asymmetrically heated continuous ink jet printers, water-based inks are more problematic. The water-based inks do not deflect as much, thus their operation is not robust. In order to improve the magnitude of the ink droplet deflection within continuous ink jet asymmetrically heated printing systems there is disclosed in commonly assigned U.S. application Ser. No. 09/470,638 filed Dec. 22, 1999 in the names of Delametter et al. a continuous ink jet printer having improved ink drop deflection, particularly for aqueous based inks, by providing enhanced lateral flow characteristics, by geometric obstruction within the ink delivery channel.

The invention to be described herein builds upon the work of Chwalek et al. and Delametter et al. in terms of constructing continuous ink jet print heads that are suitable for low-cost manufacture and preferably for print heads that can be made page wide.

Although the invention may be used with ink jet print heads that are not considered to be page wide print heads there remains a widely recognized need for improved ink jet printing systems, providing advantages for example, as to cost, size, speed, quality, reliability, small nozzle orifice size, small droplets size, low power usage, simplicity of construction in operation, durability and manufacturability. In this regard, there is a particular long-standing need for the capability to manufacture page wide, high resolution ink jet print heads. As used herein, the term “page wide” refers to print heads of a minimum length of about four inches. High-resolution implies nozzle density, for each ink color, of a minimum of about 300 nozzles per inch to a maximum of about 2400 nozzles per inch.

To take full advantage of page wide print heads with regard to increased printing speed they must contain a large number of nozzles. For example, a conventional scanning type print head may have only a few hundred nozzles per ink color. A four inch page wide print head, suitable for the printing of photographs, should have a few thousand nozzles. While a scanned print head is slowed down by the need for mechanically moving it across the page, a page wide print head is stationary and paper moves passed it. The image can theoretically be printed in a single pass, thus substantially increasing the printing speed.

There are two major difficulties in realizing page wide and high productivity ink jet print heads. The first is that nozzles have to be spaced closely together, of the order of 10 to 80 micrometers, center to center spacing. The second is that the drivers providing the power to the heaters and the electronics controlling each nozzle must be integrated with each nozzle, since attempting to make thousands of bonds or other types of connections to external circuits is presently impractical.

One way of meeting these challenges is to build the print heads on silicon wafers utilizing VLSI technology and to integrate the CMOS circuits on the same silicon substrate with the nozzles.

While a custom process, as proposed in the patent to Silverbrook, U.S. Pat. No. 5,880,759 can be developed to fabricate the print heads, from a cost and manufacturability point of view it is preferable to first fabricate the circuits using a nearly standard CMOS process in a conventional VLSI facility. Then, to post process the wafers in a separate MEMS facility for the fabrication of the nozzles and ink channels.

SUMMARY OF THE INVENTION

It is therefore an object of the invention to provide a CIJ print head that may be fabricated at lower cost and improved manufacturability as compared to those ink jet print heads known in the prior art that require more custom processing.

It is another object of the invention to provide a CIJ print head that features structure suitable for providing lateral flow components to the fluid below the heaters so that the jets are deflected more for the same amount of heat.

In accordance with a first aspect of the invention there is provided a continuous ink jet print head having a plurality of nozzles, the print head comprising: a silicon substrate including integrated circuits formed therein for controlling operation of the print head, the silicon substrate having a primary ink channel formed therein; an insulating layer or layers overlying the silicon substrate, the insulating layer or layers having a secondary channel associated with each nozzle and formed therein and communicating with the primary ink channel; a bore for each nozzle and formed in a layer or layers overlying the insulating layer or layers and communicating with the secondary channel; and wherein the insulating layer or layers includes a blocking structure between the primary ink channel and the secondary ink channel, an access being provided between the primary ink channel and the secondary ink channel to permit ink from the primary ink channel to flow about the blocking structure and to enter the secondary ink channel at a location offset from the bore to provide lateral flow components to the liquid ink entering the bore opening.

In accordance with a second aspect of the invention there is provided a method of operating a continuous ink jet print head having a plurality of nozzles with each nozzle having a bore, the method comprising: providing liquid ink under pressure in a primary ink channel formed in a silicon substrate having a series of integrated circuits formed therein for controlling operation of the print head; causing the ink to flow into a secondary ink channel formed in an insulating layer or layers overlying the silicon substrate; asymmetrically heating of the ink as it flows around heaters to control the direction of an ink droplet from the nozzle; and providing lateral flow components to an ink jet or stream that is established by having ink flow about a blocking structure formed in the insulating layer or layers overlying the silicon substrate.

In accordance with a third aspect of the invention there is provided a method of forming a continuous ink jet print head having a plurality of nozzles and a bore associated with each nozzle, the method comprising: providing a silicon substrate having integrated circuits for controlling operation of the print head, the silicon substrate having an insulating layer or layers formed thereon, the insulating layer or layers having electrical conductors formed therein that are electrically connected to circuits formed in the silicon substrate; forming in the insulating layer or layers a secondary ink channel and a blocking structure for controlling lateral flow of ink from a primary ink channel formed in the silicon substrate to a secondary ink channel formed in the insulating layer or layers; forming a bore communicating with the secondary ink channel; and forming in the silicon substrate the primary ink channel communicating with the secondary ink channel.

These and other objects, features and advantages of the present invention will become apparent to those skilled in the art upon reading of the following detailed description when taken in conjunction with the drawings wherein there are shown and described illustrative embodiments of the invention.

BRIEF DESCRIPTION OF THE DRAWINGS

While the specification concludes with claims particularly pointing out and distinctly claiming the subject matter of the present invention, it is believed the invention will be better understood from the following detailed description when taken in conjunction with the accompanying drawings.

DETAILED DESCRIPTION OF THE INVENTION

This description will be directed in particular to elements forming part of, or cooperating more directly with, apparatus in accordance with the present invention. It is to be understood that elements not specifically shown or described may take various forms well known to those skilled in the art.

Figure 13:
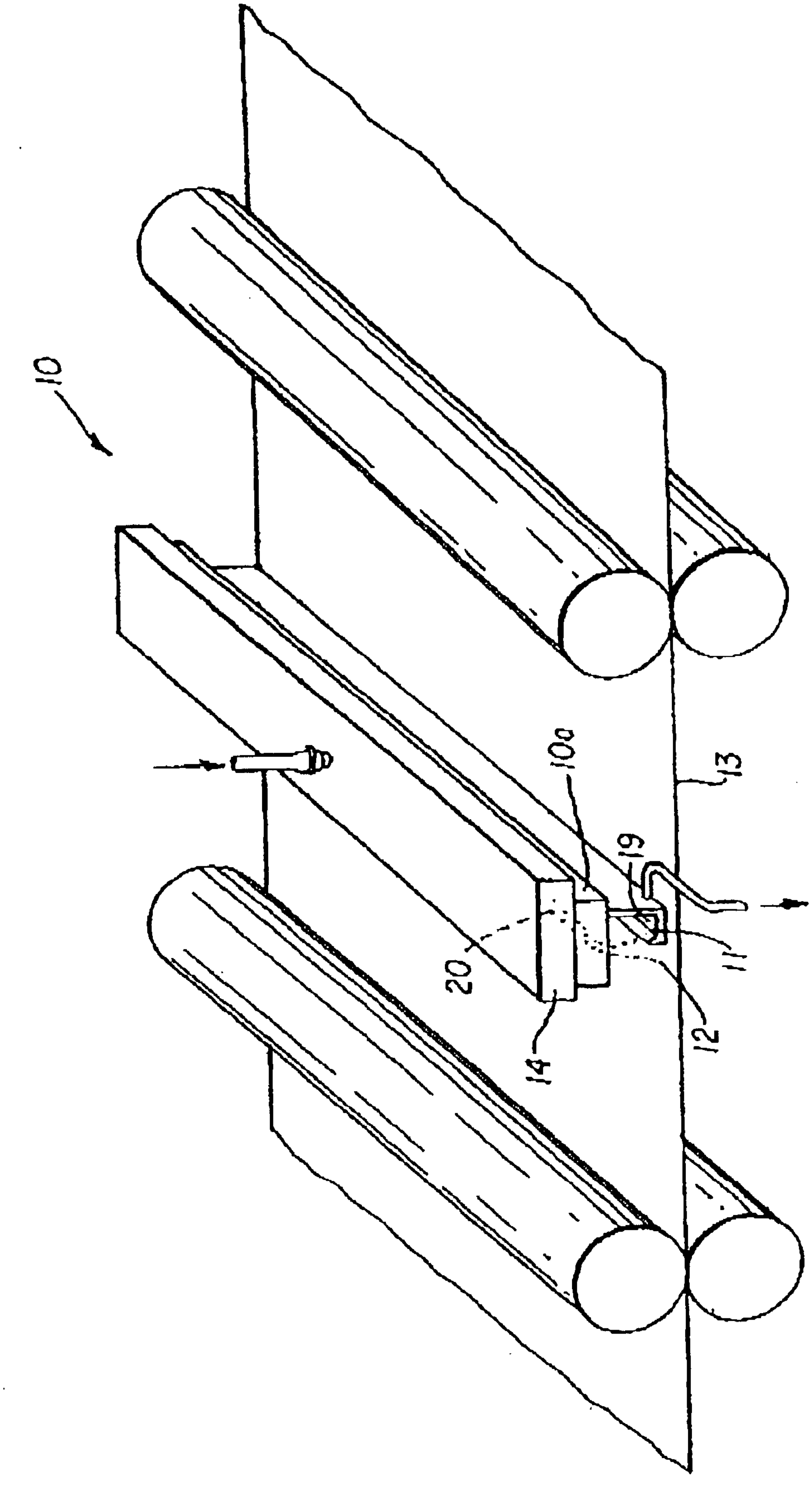
FIG. 13 illustrates a schematic diagram of an exemplary continuous ink jet print head and nozzle array as a print medium (e.g. paper) rolls under the ink jet print head.

Referring to FIG. 13, a continuous ink jet printer system is generally shown at 10. The print head 10*a*, from which extends an array of nozzles 20, incorporates heater control circuits (not shown).

Heater control circuits read data from an image memory, and send time-sequenced electrical pulses to the heaters of the nozzle array 20. These pulses are applied an appropriate length of time, and to the appropriate nozzle, so that drops formed from a continuous ink jet stream will form spots on a recording medium 13, in the appropriate position designated by the data sent from the image memory. Pressurized ink travels from an ink reservoir (not shown) to an ink delivery channel formed in substrate 14 and through nozzle array 20 on to either the recording medium 13 or the gutter 19. The ink gutter 19 is configured to catch undeflected ink droplets 11 while allowing deflected droplets 12 to reach a recording medium. The general description of the continuous ink jet printer system of FIG. 13 is also suited for use as a general description in the printer system of the invention.

Figure 1:
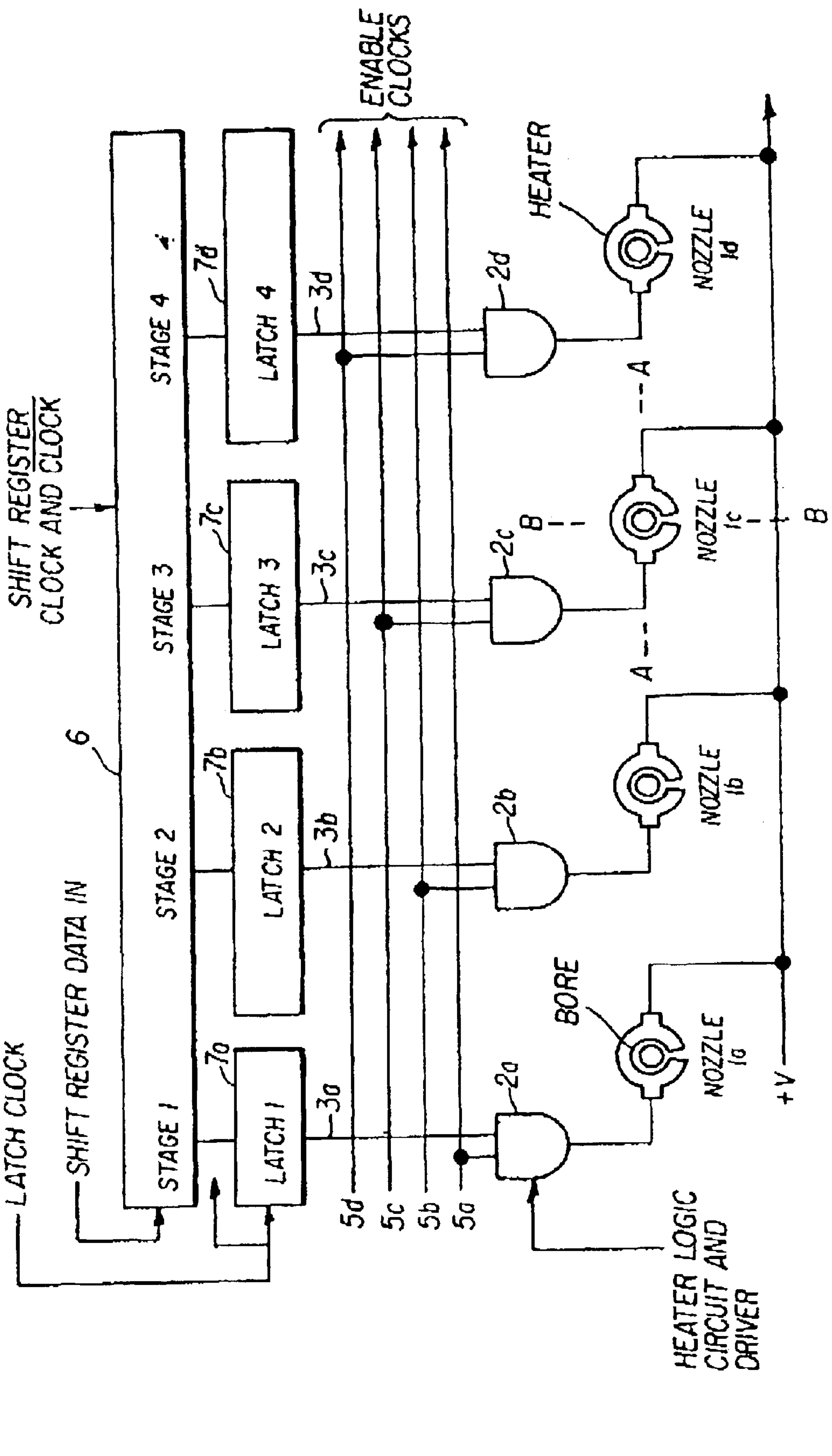
FIG. 1 is a schematic and fragmentary top view of a print head constructed in accordance with the present invention.

Referring to FIG. 1, there is shown a top view of an ink jet print head according to the teachings of the present invention. The print head comprises an array of nozzles 1*a*–1*d* arranged in a line or a staggered configuration. Each nozzle is addressed by a logic AND gate (2*a*–2*d*) which each contain logic circuitry and a beater driver transistor (not shown). The logic circuitry causes a respective driver transistor to turn on if a respective signal on a respective data input line (3*a*–3*d*) to the AND gate (2*a*–2*d*) and the respective enable clock lines (5*a*–5*d*), which is connected to the logic gate, are both logic ONE. Furthermore, signals on the enable clock lines (5*a*–5*d*) determine durations of the lengths of time current flows through the heaters in the particular nozzles 1*a*–1*d*. Data for driving the heater driver transistor may be provided from processed image data that is input to a data shift register 6. The latch register 7*a*–7*d*, in response to a latch clock, receives the data from a respective shift register stage and provides a signal on the lines 3*a*–3*d* representative of the respective latched signal (logical ONE or ZERO) representing either that a dot is to be printed or not on a receiver. In the third nozzle, the lines A—A and B—B define the direction in which cross-sectional views are taken at FIGS. 1A and 1B.

Figure 1A:
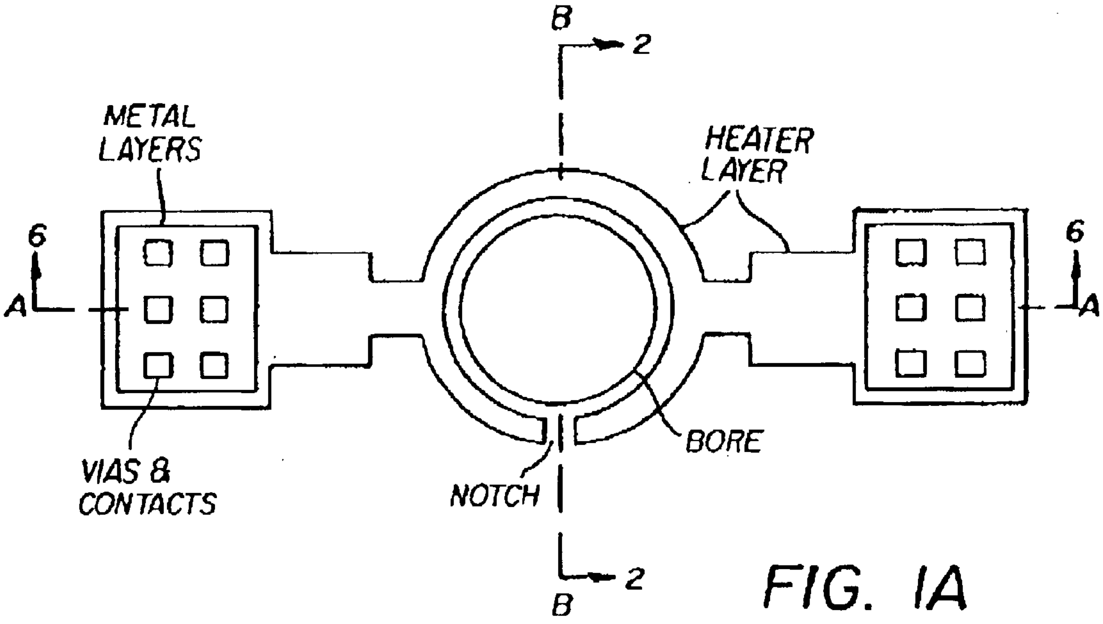
FIG. 1A is a simplified top view of a nozzle with a "notch" type heater for a CIJ print head in accordance with the invention.
Figure 1B:
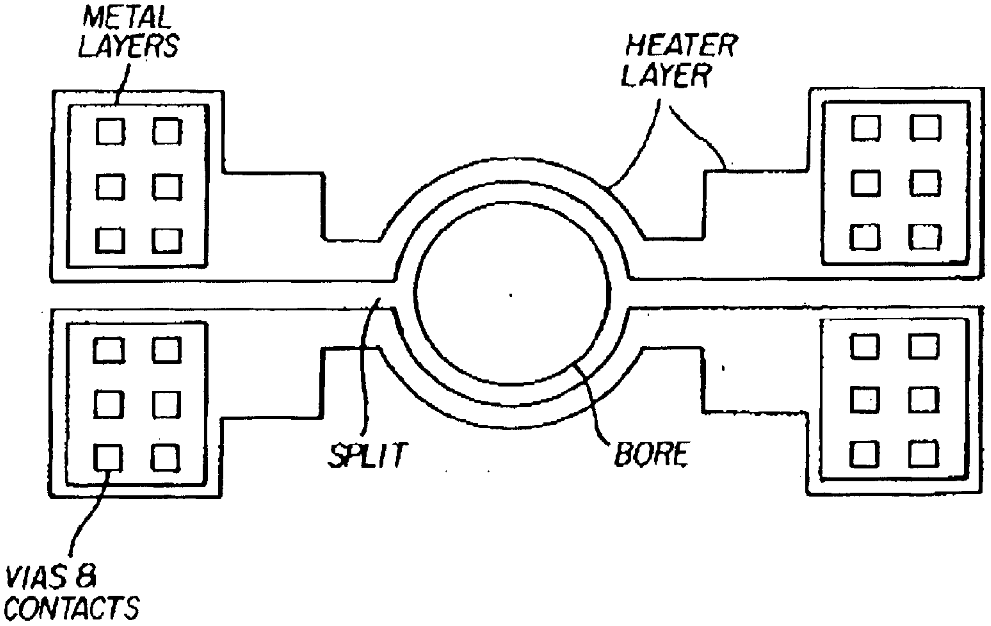
FIG. 1B is a simplified top view of a nozzle with a split type heater for a CIJ print head made in accordance with the invention.

FIGS. 1A and 1B show more detailed top views of the two types of heaters (the "notch type" and "split type" respectively) used in CIJ print heads. They produce asymmetric heating of the jet and thus cause ink jet deflection. Asymmetrical application of heat merely means supplying electrical current to one or the other section of the heater independently in the case of a split type heater. In the case of a notch type heater applied current to the notch type heater will inherently involve an asymmetrical heating of the meniscus. With reference now to FIG. 1A there is illustrated a top view of an ink jet print bead nozzle with a notched type heater. The beater is formed adjacent the exit opening of the nozzle. The heater element material substantially encircles the nozzle bore but for a very small notched out area, just enough to cause an electrical open. As noted also with reference to FIG. 1 one side of each heater is connected to a common bus line, which in turn is connected to the power supply typically +5 volts. The other side of each heater is connected to a logic AND gate within which resides an MOS transistor driver capable of delivering up to 30 mA of current to that heater. The AND gate has two logic inputs. One is from the Latch 7*a–d* which has captured the information from the respective shift register stage indicating whether the particular heater will be activated or not during the present line time. The other input is the enable clock that determines the length of time and sequence of pulses that are applied to the particular heater. Typically there are two or more enable clocks in the print head so that neighboring heaters can be turned on at slightly different times to avoid thermal and other cross talk effects.

With reference to FIG. 1B there is illustrated the nozzle with a split type heater wherein there are essentially two semicircular heater elements surrounding the nozzle bore adjacent the exit opening thereof. Separate conductors are provided to the upper and lower segments of each semi circle, it being understood that in this instance upper and lower refer to elements in the same plane. Vias are provided that electrically contact the conductors to metal layers associated with each of these conductors. These metal layers are in turn connected to driver circuitry formed on a silicon substrate as will be described below.

Figure 2:
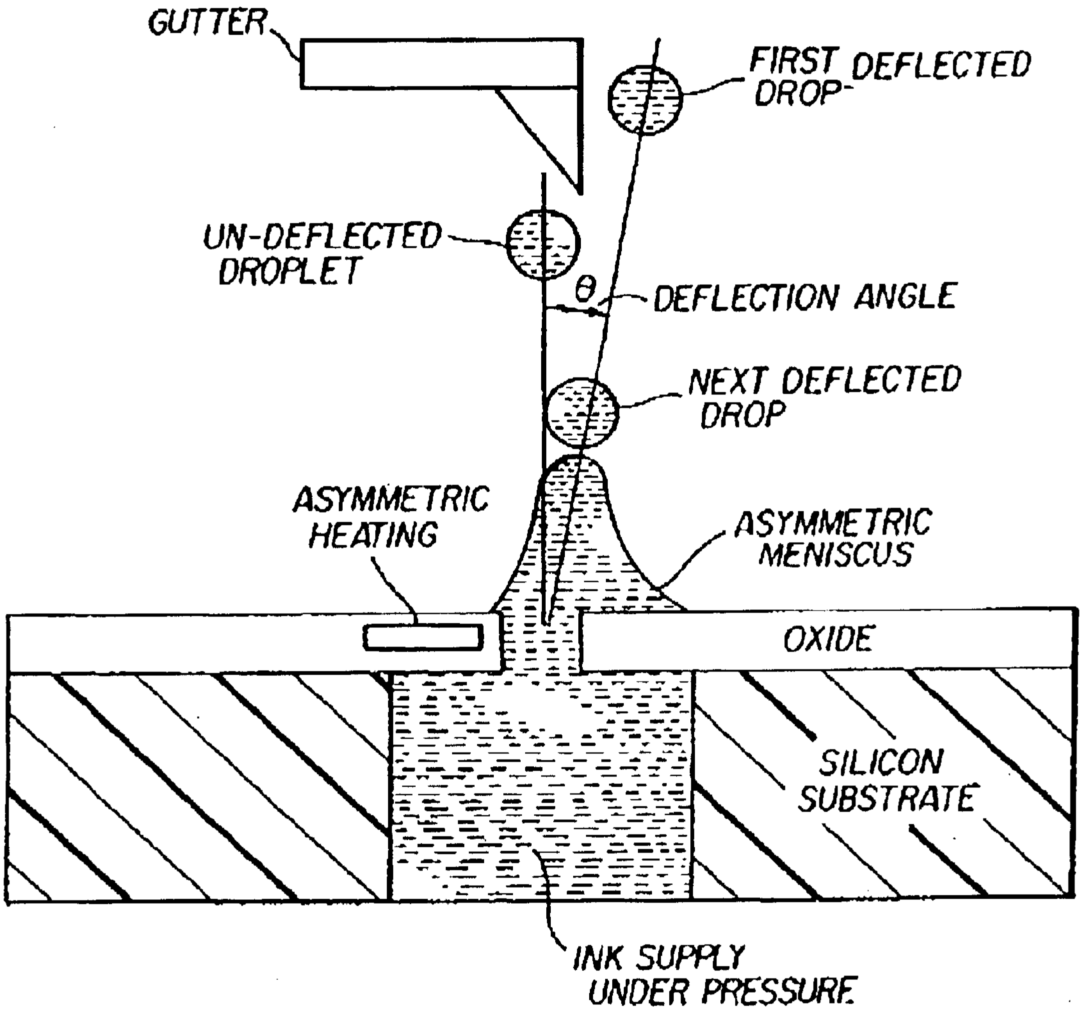
FIG. 2 is cross-sectional view of the nozzle with notch type heater, the sectional view taken along line B—B of FIG. 1A.

In FIG. 2 there are shown a simplified cross-sectional view of an operating nozzle across the B—B direction. As mentioned above, there is an ink channel formed under the nozzle bores to supply the ink. This ink supply is under pressure typically between 15 to 25 psi for a bore diameter of about 8.8 micrometers. The ink in the delivery channel emanates from a pressurized reservoir (not shown), leaving the ink in the channel under pressure. The constant pressure can be achieved by employing an ink pressure regulator (not shown). Without any current flowing to the heater, a jet forms that is straight and flows directly into the gutter. On the surface of the print head a symmetric meniscus forms around each nozzle that is a few microns larger in diameter than the bore. If a current pulse is applied to the heater, the meniscus in the heated side pulls in and the jet deflects away from the heater. The droplets that form then bypass the gutter and land on the receiver. When the current through the heater is returned to zero, the meniscus becomes symmetric again and the jet direction is straight. The device could just as easily operate in the opposite way, that is, the deflected droplets are directed into the gutter and the printing is done on the receiver with the non-deflected droplets. Also, having all the nozzles in a line is not absolutely necessary. It is just simpler to build a gutter that is essentially a straight edge rather than one that has a staggered edge that reflects the staggered nozzle arrangement.

In typical operation, the heater resistance is of the order of 400 ohms, the current amplitude is between 10 to 20 mA, the pulse duration is about 2 microseconds and the resulting deflection angle for pure water is of the order of a few degrees, in this regard reference is made to U.S. application Ser. No. 09/221,256, entitled "Continuous Ink Jet Print Head Having Power-Adjustable Multi-Segmented Heaters" and to U.S. application Ser. No. 09/221,342 entitled "Continuous Ink Jet Print Head Having Multi-Segmented Heaters", both filed Dec. 28, 1998.

The application of periodic current pulses causes the jet to break up into synchronous droplets, to the applied pulses. These droplets form about 100 to 200 micrometers away from the surface of the print head and for an 8.8 micrometers diameter bore and about 2 microseconds wide, 200 kHz pulse rate, they are typically 3 to 4 pL in size.

Figure 3:
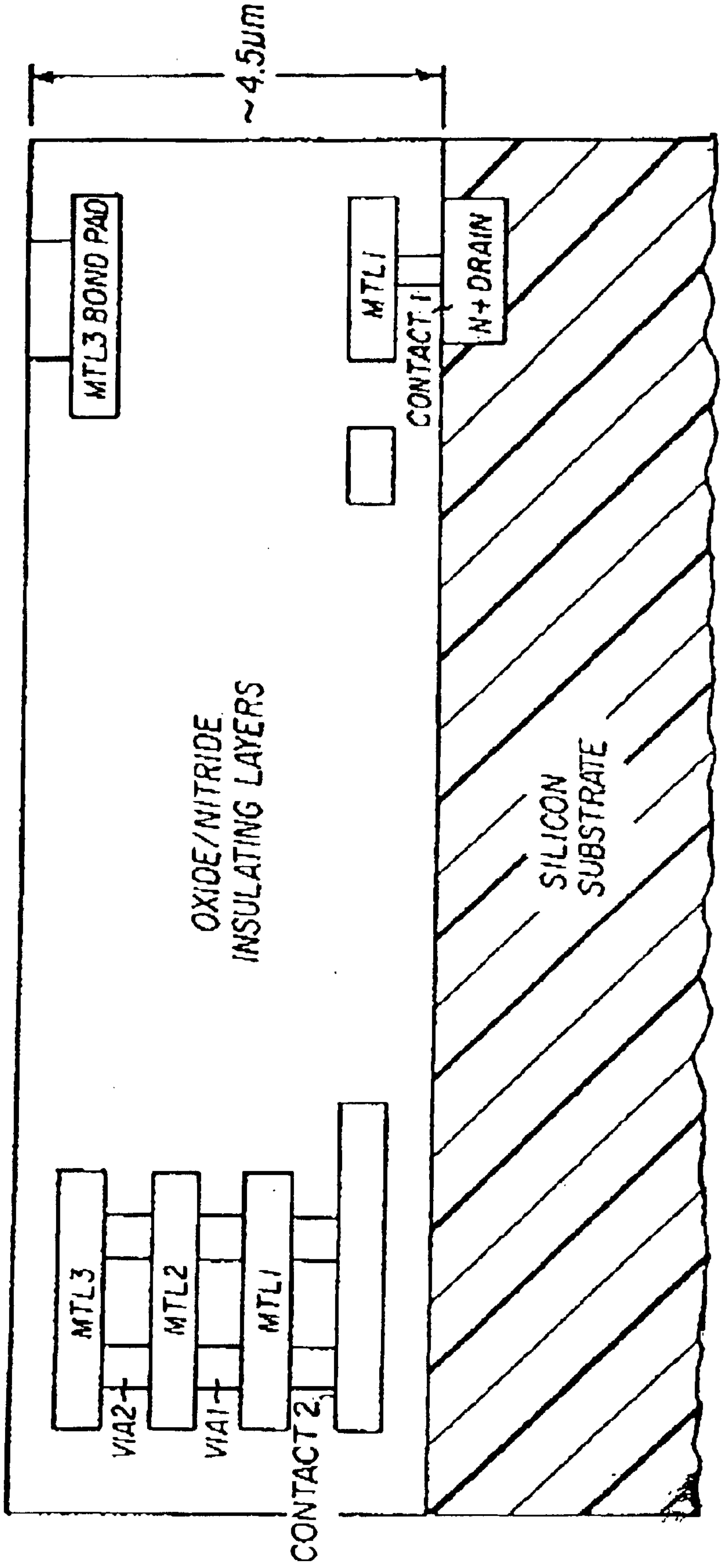
FIG. 3 is a simplified schematic sectional view taken along line A–B of FIG. 1A and illustrating the nozzle area just after the completion of all the conventional CMOS fabrication steps.

The cross-sectional view taken along sectional line A–B and shown in FIG. 3 represents an incomplete stage in the formation of a print head in which nozzles are to be later formed in an array wherein CMOS circuitry is integrated on the same silicon substrate.

As was mentioned earlier, the CMOS circuitry is fabricated first on the silicon wafers. The CMOS process may be a standard 0.5 micrometers mixed signal process incorporating two levels of polysilicon and three levels of metal on a six inch diameter wafer. Wafer thickness is typically 675 micrometers. In FIG. 3, this process is represented by the three layers of metal, shown interconnected with vias. Also polysilicon level 2 and an N+ diffusion and contact to metal layer 1 are drawn to indicate active circuitry in the silicon substrate. Gates of CMOS transistors may be formed in the polysilicon layers.

Because of the need to electrically insulate the metal layers, dielectric layers are deposited between them making the total thickness of the film on top of the silicon wafer about 4.5 micrometers.

The structure illustrated in FIG. 3 basically would provide the necessary transistors and logic gates for providing the control components illustrated in FIG. 1.

As a result of the conventional CMOS fabrication steps a silicon substrate of approximately 675 micrometers in thickness and about 6 inches in diameter is provided. Larger or smaller diameter silicon wafers can be used equally as well. A plurality of transistors are formed in the silicon substrate through conventional steps of selectively depositing various materials to form these transistors as is well known. Supported on the silicon substrate are a series of layers eventually forming an oxide/nitride insulating layer that has one or more layers of polysilicon and metal layers formed therein in accordance with desired pattern. Vias are provided between various layers as needed and openings may be pre-provided in the surface for allowing access to metal layers to provide for bond pads. As indicated in the FIG. 3 the oxide/nitride insulating layers is about 4.5 micrometers in thickness. The structure illustrated in FIG. 3 basically would provide the necessary interconnects, transistors and logic gates for providing the control components illustrated in FIG. 1.

As noted above in a CIJ printing system it is desirable that jet deflection could be further increased by increasing the portion of ink entering the bore of the nozzle with lateral rather than axial momentum. Such can be accomplished by blocking some of the fluid having axial momentum by building a block in the center of each nozzle array construct just below the nozzle bore.

Figure 4:
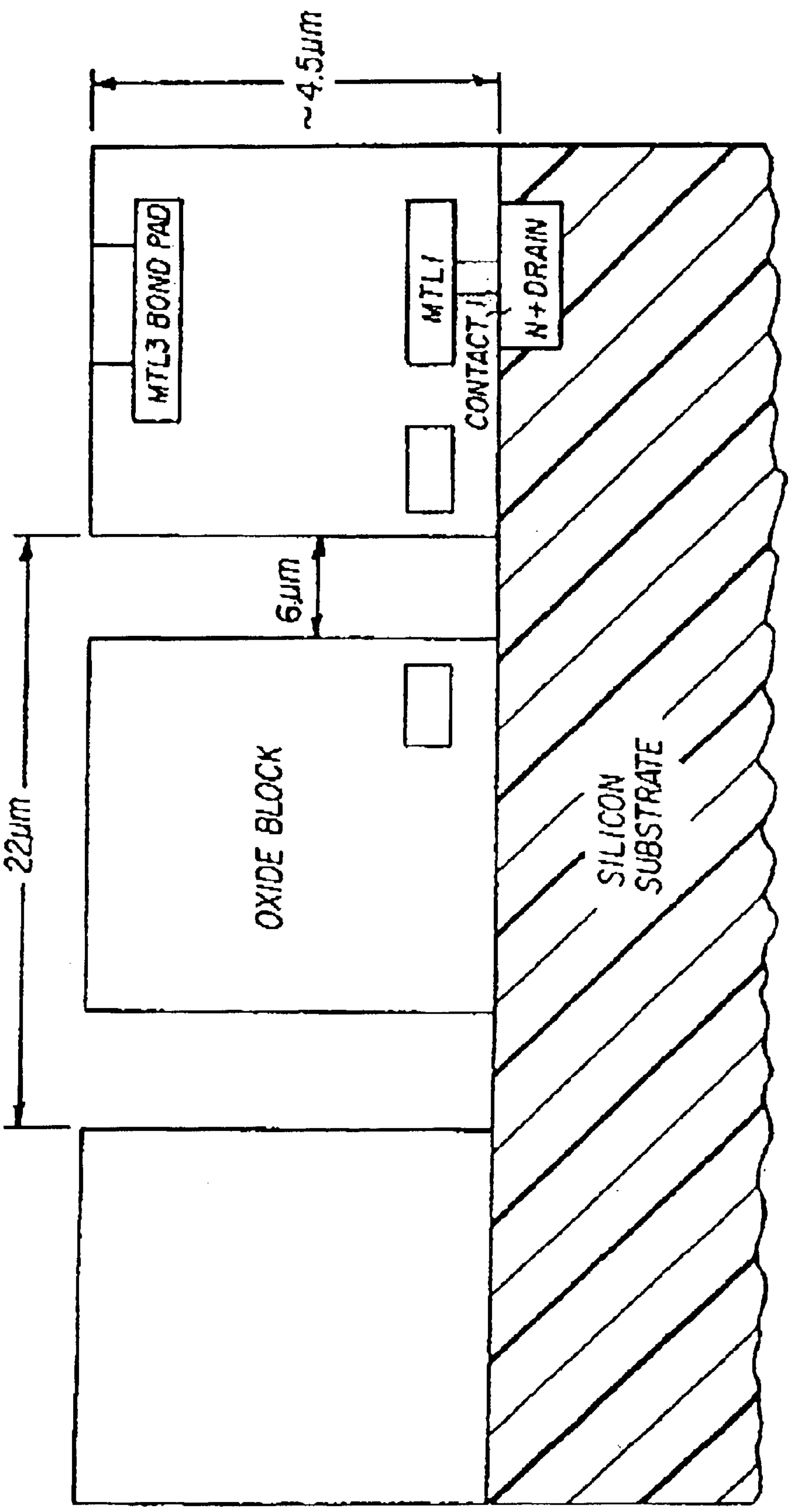
FIG. 4 is a schematic cross-sectional view taken along the line B—B in the nozzle area of FIG. 1A after the definition of the oxide block for lateral flow.
Figure 5:
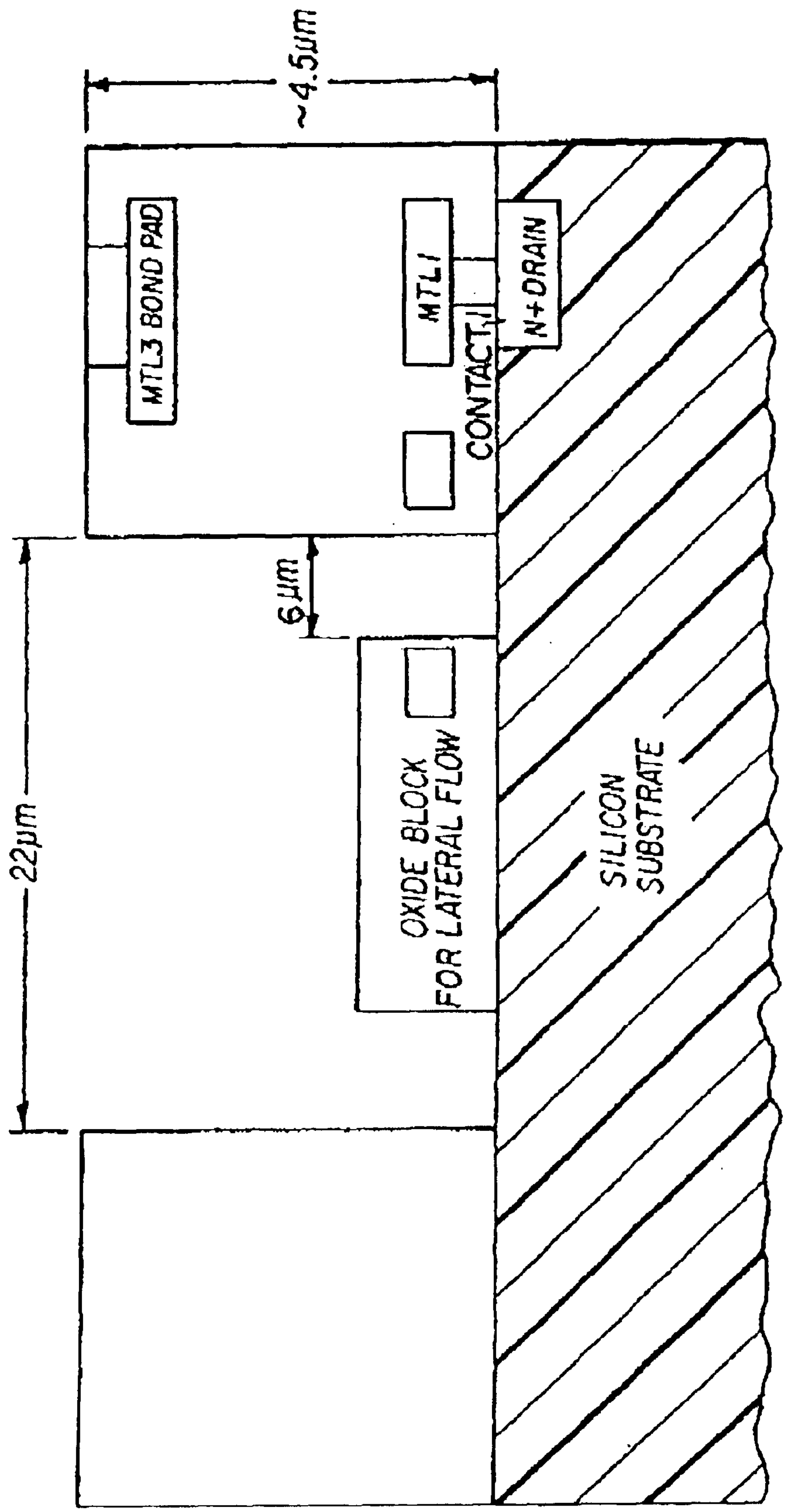
FIG. 5 is a schematic cross-sectional view taken along the line B—B in the nozzle area of FIG. 1A after the further definition of the oxide block for lateral flow.
Figure 6:
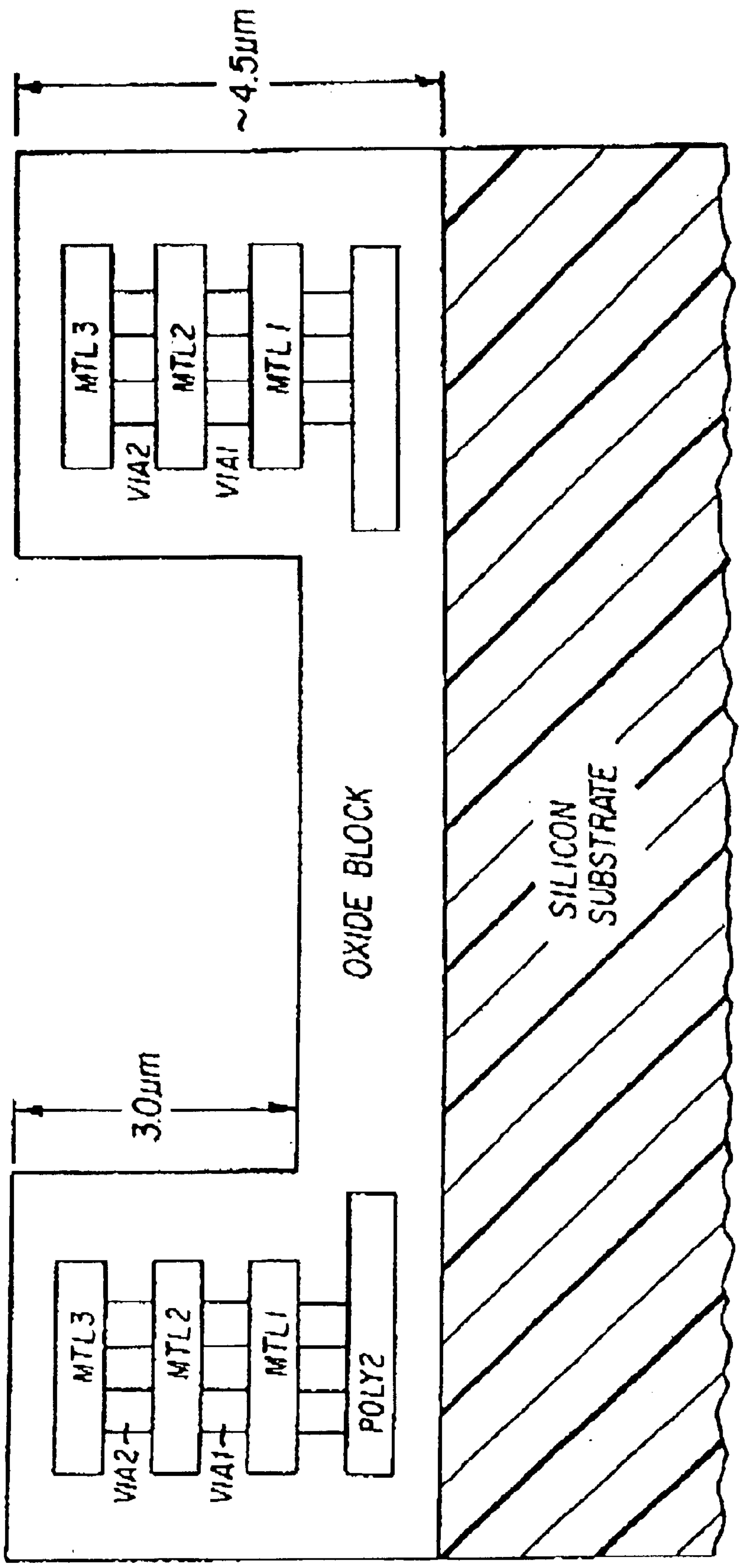
FIG. 6 is a schematic cross-sectional view taken along line A—A in the nozzle area of FIG. 1A after the definition of the oxide block for lateral flow.
Figure 7:
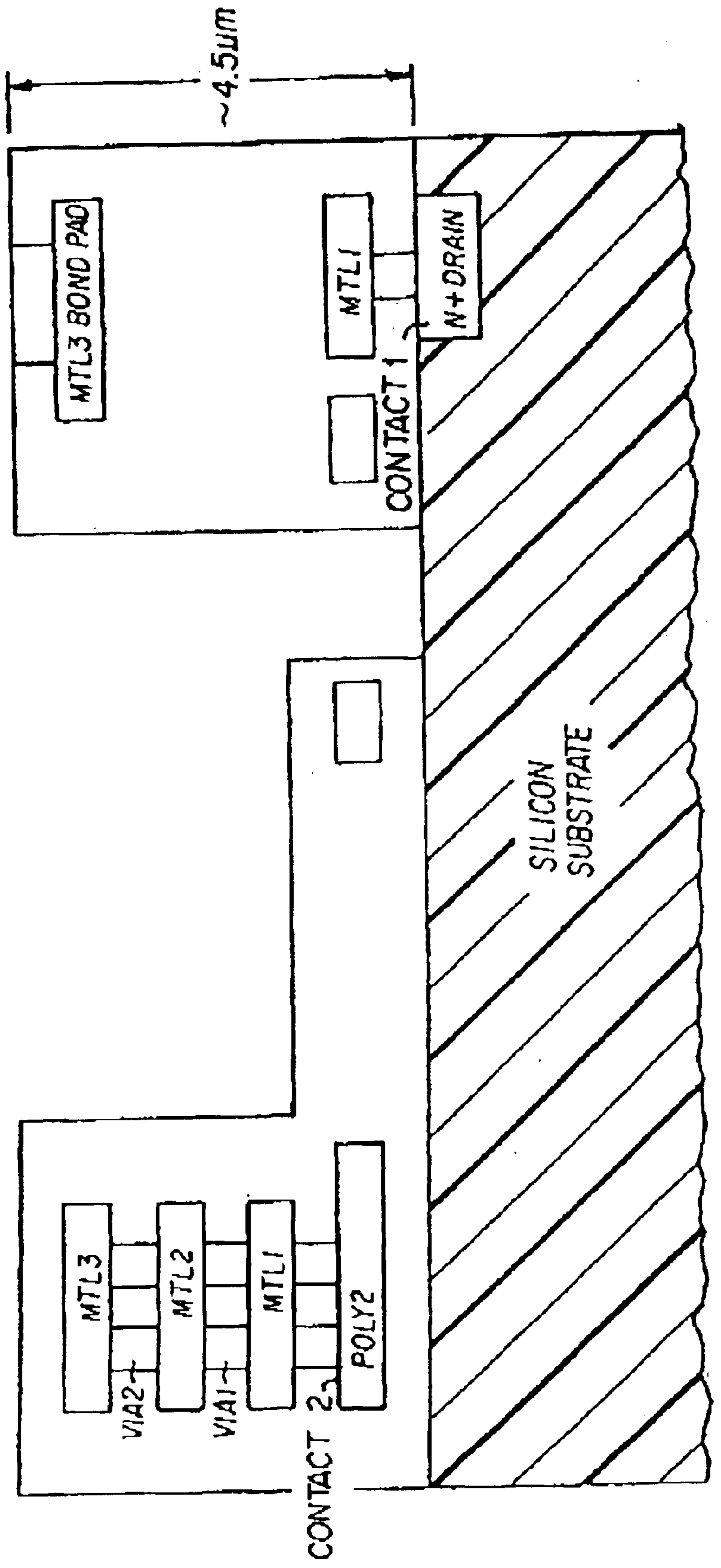
FIG. 7 is a schematic cross-sectional view taken along line A–B in the nozzle area after the definition of the oxide block used for lateral flow.

In accordance with the invention a method of constructing of a lateral flow structure will now be described with reference to FIG. 3 which as noted above shows a cross-sectional view of the silicon wafer in the vicinity of the nozzle at the end of the CMOS fabrication sequence. It will be understood of course that although the description will be provided in the following paragraphs relative to formation of a single nozzle that the process is simultaneously applicable to a whole series of nozzles formed in a row along the wafer. The first step in the post-processing sequence is to apply a mask to the front of the wafer at the region of each nozzle opening to be formed. The mask is shaped so as to allow an etchant to open two 6 micrometer wide semicircular openings co-centric with the nozzle bore to be formed. The outside edges of these openings correspond to a 22 micrometers diameter circle. The dielectric layers in the semicircular regions are then etched completely to the silicon surface as shown in FIG. 4. A second mask is then applied and is of the shape to permit selective etching of the oxide block shown in FIG. 5. Upon etching with the second mask in place the oxide block is etched down to a final thickness or height from the silicon substrate of about 1.5 micrometers as shown in FIG. 5 for a cross-section along sectional line B—B and in FIG. 6 for a cross-section along sectional line A—A. A cross-sectional view of the nozzle area along A–B is shown in FIG. 7.

Thereafter openings in the dielectric layer are filled with a sacrificial film such as amorphous silicon or polyimide and the wafers are planarized.

Figure 8:
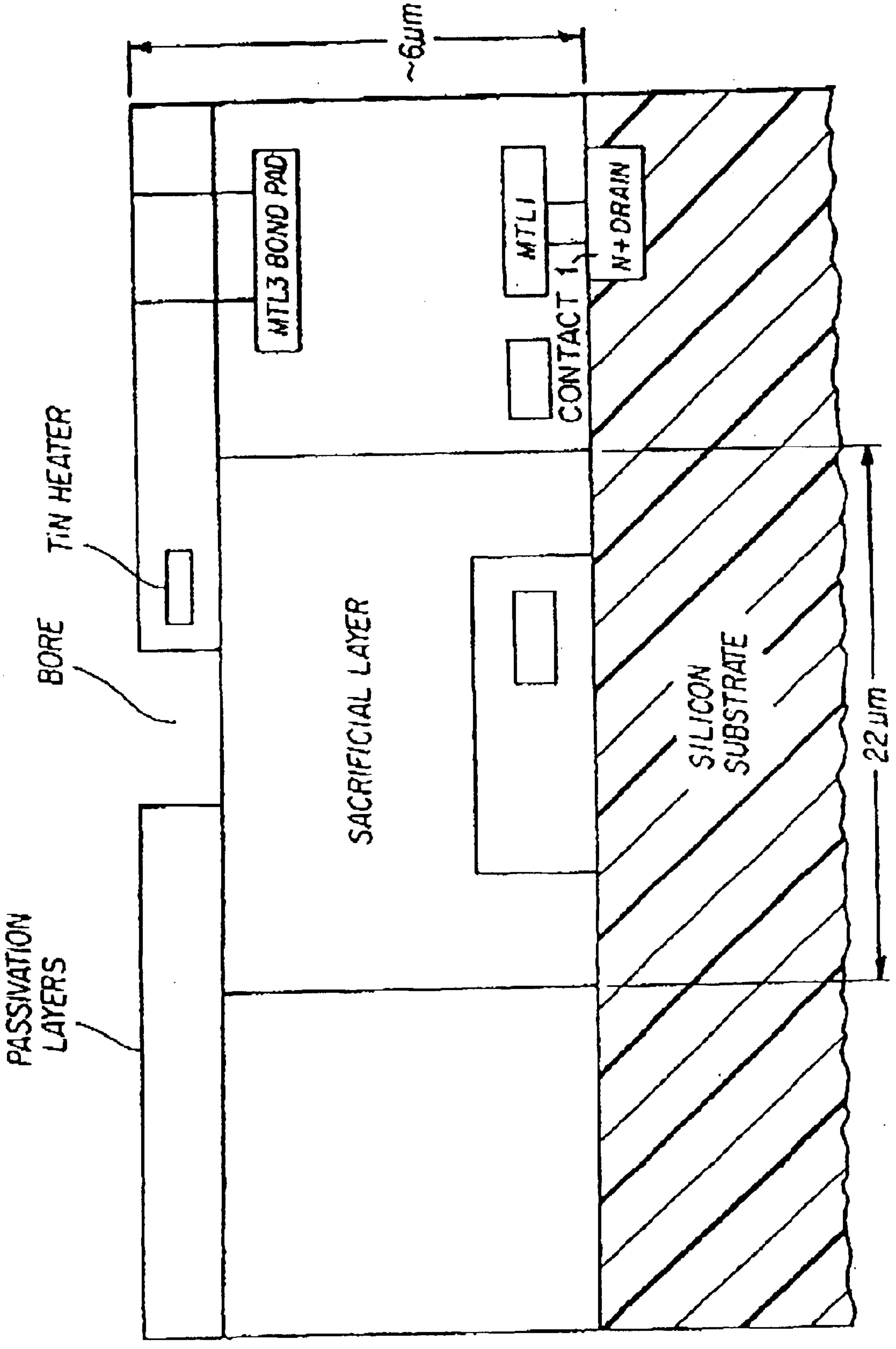
FIG. 8 is a schematic cross-sectional view taken along line B—B in the nozzle area after planarization of the sacrificial layer and deposition and definition of the passivation and heater layers and formation of the nozzle bore.
Figure 9:
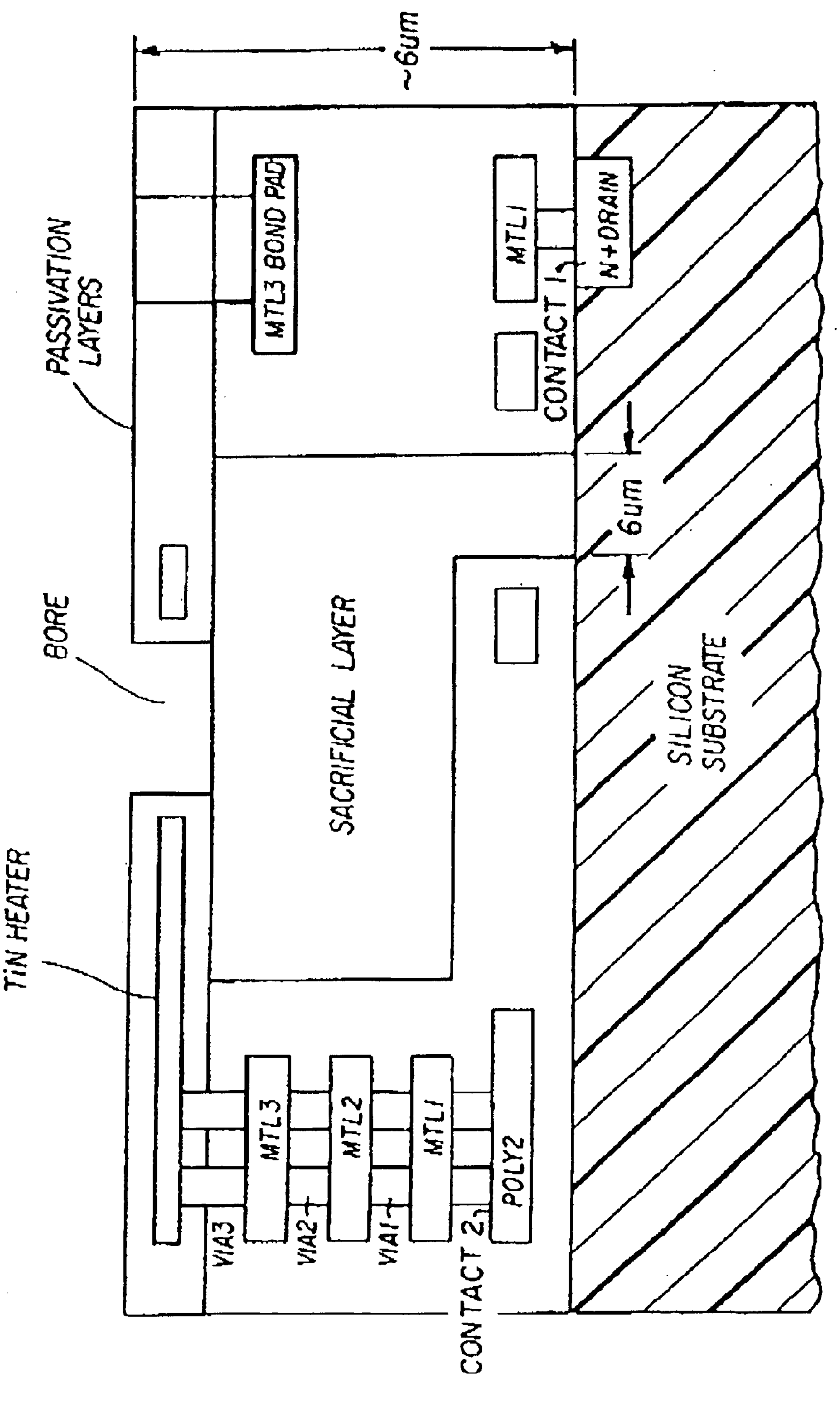
FIG. 9 is a schematic cross-sectional view taken along line A–B in the nozzle area after planarization of the sacrificial layer and deposition and definition of the passivation and heater layers and formation of the bore.

A thin, 3500 angstroms protection membrane or passivation layer, such as PECVD Si3N4, is deposited next and then the via3's to the metal3 level (mtl3) are opened. See FIGS. 8 and 9 for reference. A thin layer of Ti/TiN is deposited next over the whole wafer followed by a much thicker W layer. The surface is then planarized in a chemical mechanical polishing process sequence that removes the W (wolfram) and Ti/TiN films from everywhere except from inside the via3's. Alternatively, the via3's can be etched with sloped sidewalls so that the heater layer, which is deposited next, can directly contact the metal3 layer. The heater layer consisting of about 50 angstroms of Ti and 600 angstroms of TiN is deposited and then patterned. A final thin protection (typically referred to as passivation) layer is deposited next. This layer must have properties that, as the one below the heater, protects the heater from the corrosive action of the ink, it must not be easily fouled by the ink and it can be cleaned easily when fouled. It also provides protection against mechanical abrasion and has the desired contact angle to the ink. To satisfy all these requirements, the passivation layer may consist of a stack of films of different materials. The final film thickness encompassing the heater is about 1.5 micrometers. A bore mask is applied next to the front of the wafer and the passivation layers are etched to open the bore for each nozzle and the bond pads. FIGS. 8 and 9 show respective cross-sectional views of each nozzle at this stage. Although only one of the bond pads is shown it will be understood that multiple bond pads are formed in the nozzle array. The various bond pads are provided to make respective connections of data, latch clock, enable clocks, and power provided from a circuit board mounted adjacent the print head or from a remote location.

Figure 10:
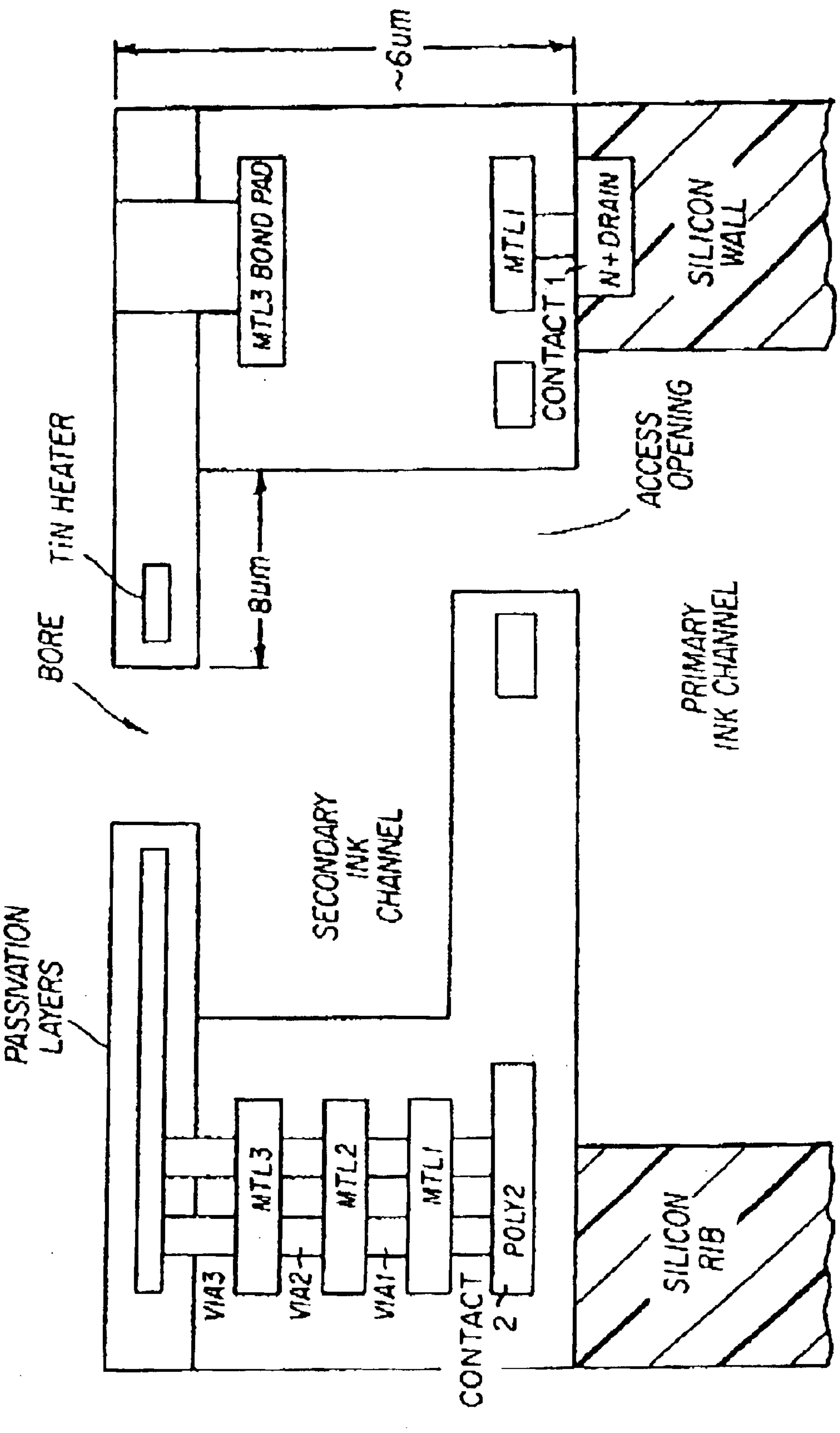
FIG. 10 is a schematic cross-sectional view taken along line A–B in the nozzle area after definition and etching of the ink channels in the silicon wafer and removal of the sacrificial layer.

The silicon wafer is then thinned from its initial thickness of 675 micrometers to approximately 300 micrometers. A mask to open the ink channels is then applied to the backside of the wafer and the silicon is then etched in an STS deep silicon etch system, all the way to the front surface of the silicon. Finally the sacrificial layer is etched from the backside and front side resulting in the finished device shown in FIG. 10. Alignment of the ink channel openings in the back of the wafer to the nozzle array in the front of the wafer may be provided with an aligner system such as the Karl Suss 1X aligner system.

Figure 11:
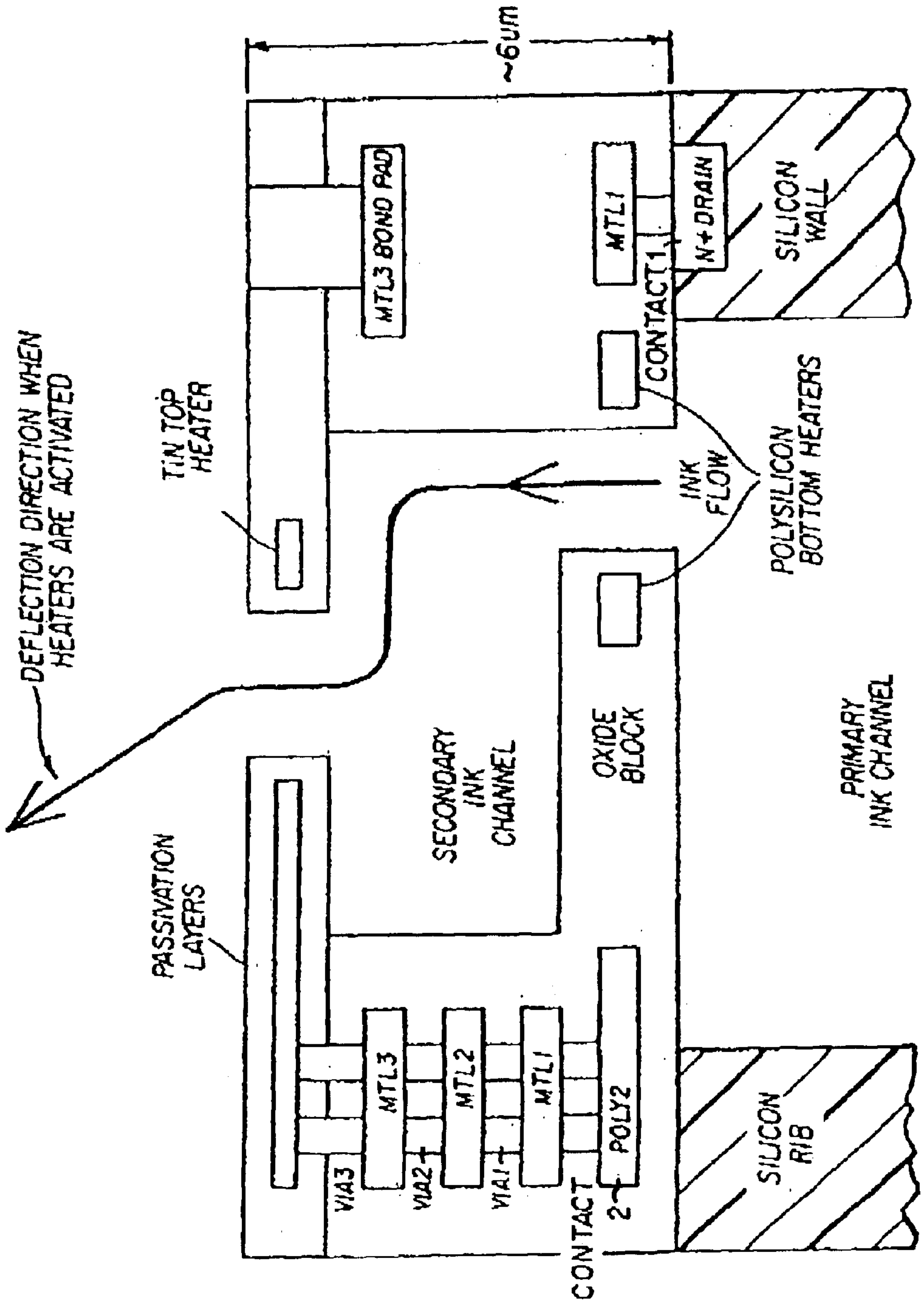
FIG. 11 is a schematic cross-sectional view taken along line A–B in the nozzle area showing top and bottom heaters providing lower temperature operation of the heaters and increased deflection of the jet stream.
Figure 12:
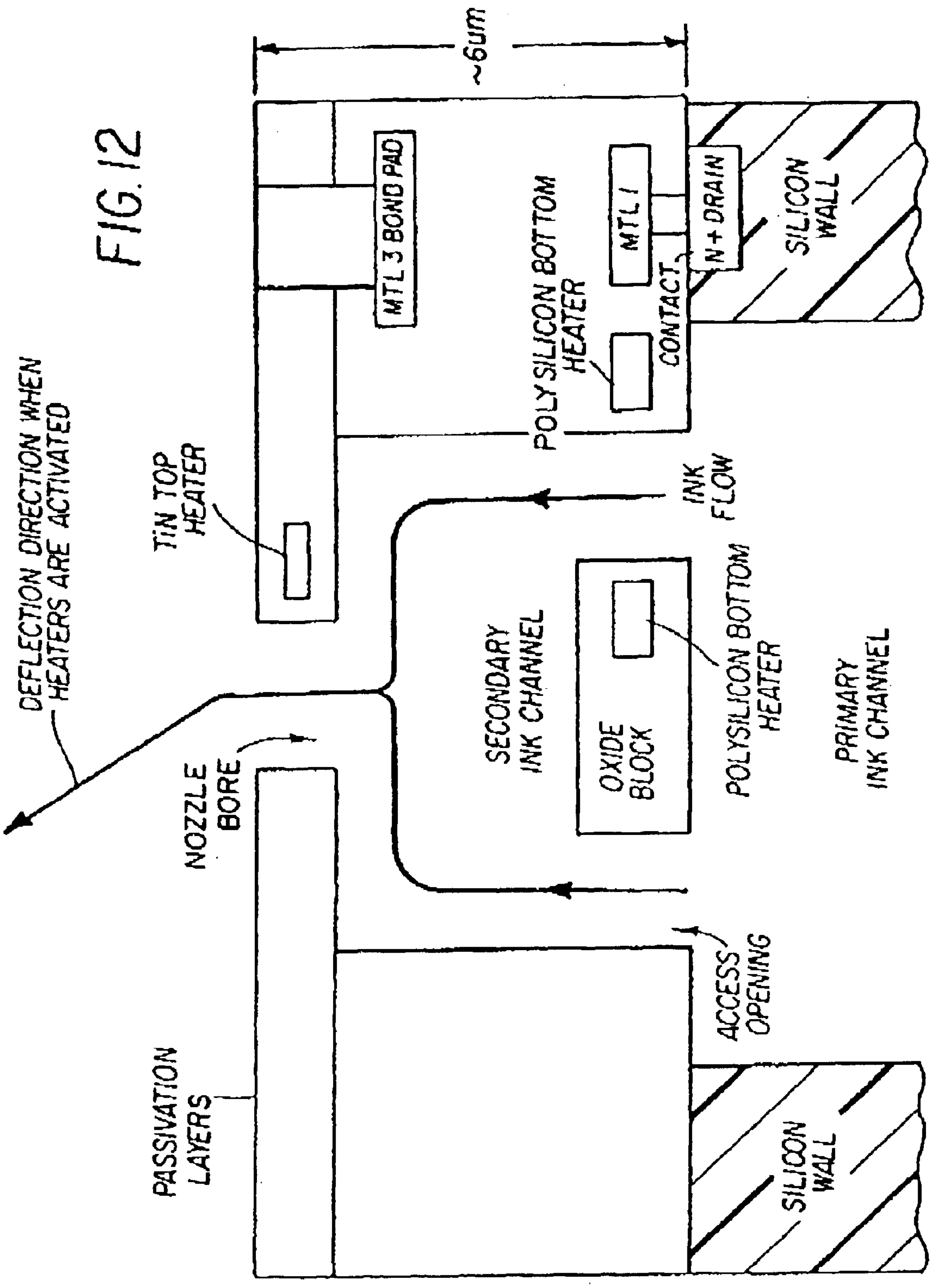
FIG. 12 is a schematic cross-sectional view similar to that of FIG. 11 but taken along line B—B.

As illustrated in FIGS. 11 and 12 a polysilicon type heater can be incorporated in the bottom of the dielectric stack of each nozzle. These heaters also contribute to reducing the viscosity of the ink asymmetrically. Thus, as illustrated in FIG. 12, ink flow passing through the access opening at the right side of the blocking structure will be heated while ink flow passing through the access opening at the left side of the blocking structure will not be heated. This asymmetric preheating of the ink flow tends to reduce the viscosity of ink having the lateral momentum components desired for deflection and because more ink will tend to flow where the viscosity is reduced there is a greater tendency for deflection of the ink in the desired direction; i.e., away from the heating elements adjacent the bore. The polysilicon type heating elements can be of similar configuration to that of the primary heating elements adjacent the bore. Where heaters are used at both the top and the bottom of each nozzle bore, as illustrated in these Figures, the temperature at which each individual heater operates can be reduced dramatically. The reliability of the TiN heaters is much improved when they are allowed to operate at temperatures well below their annealing temperature. The lateral flow structure made using the oxide block allows the location of the oxide block to be aligned to within 0.02 micrometers relative to the nozzle bore.

As shown schematically in FIG. 11, the ink flowing into the bore is dominated by lateral momentum components, which is what is desired for increased droplet deflection.

The ink channel formed comprises a rectangular cavity beneath the nozzle array. However, this provides a long cavity that passes centrally through the silicon chip which is the print head. While this design may work well, a long cavity in the center of the die tends to structurally weaken the print head so that if the print head is subjected to torsional stresses, such as during packaging, the membrane could crack. Also, for long print heads, pressure variations in the ink channels due to low frequency pressure waves can cause jet jitter. Description will now be provided of an improved design. An improvement consists of leaving behind a silicon bridge or rib between each nozzle of the nozzle array during the etching of the ink channel. These bridges extend all the way from the back of the silicon wafer to the front of the silicon wafer. The ink channel pattern defined in the back of the wafer, therefore, is no longer a long rectangular recess running parallel to the direction of the row of nozzles but is instead a series of smaller rectangular cavities or channels each feeding a single nozzle. To reduce fluidic resistance each individual ink channel is fabricated to be a rectangle of 20 micrometers along the direction of the row of nozzles and 120 micrometers in the direction orthogonal to the row of nozzles.

As may be seen in FIGS. 11 and 12 a blocking structure formed in the oxide or insulating layer or layers causes the ink, which is under pressure in the primary ink channel, to flow about the blocking structure which is axially aligned with the nozzle bore and to develop lateral momentum components as it flows through an access opening in the insulating layer to reach the secondary ink channel which communicates with the nozzle bore. Thus, jet stream deflection can be increased by increasing the portion of the ink entering the bore of the nozzle with lateral rather than axial momentum components.

Figure 14:
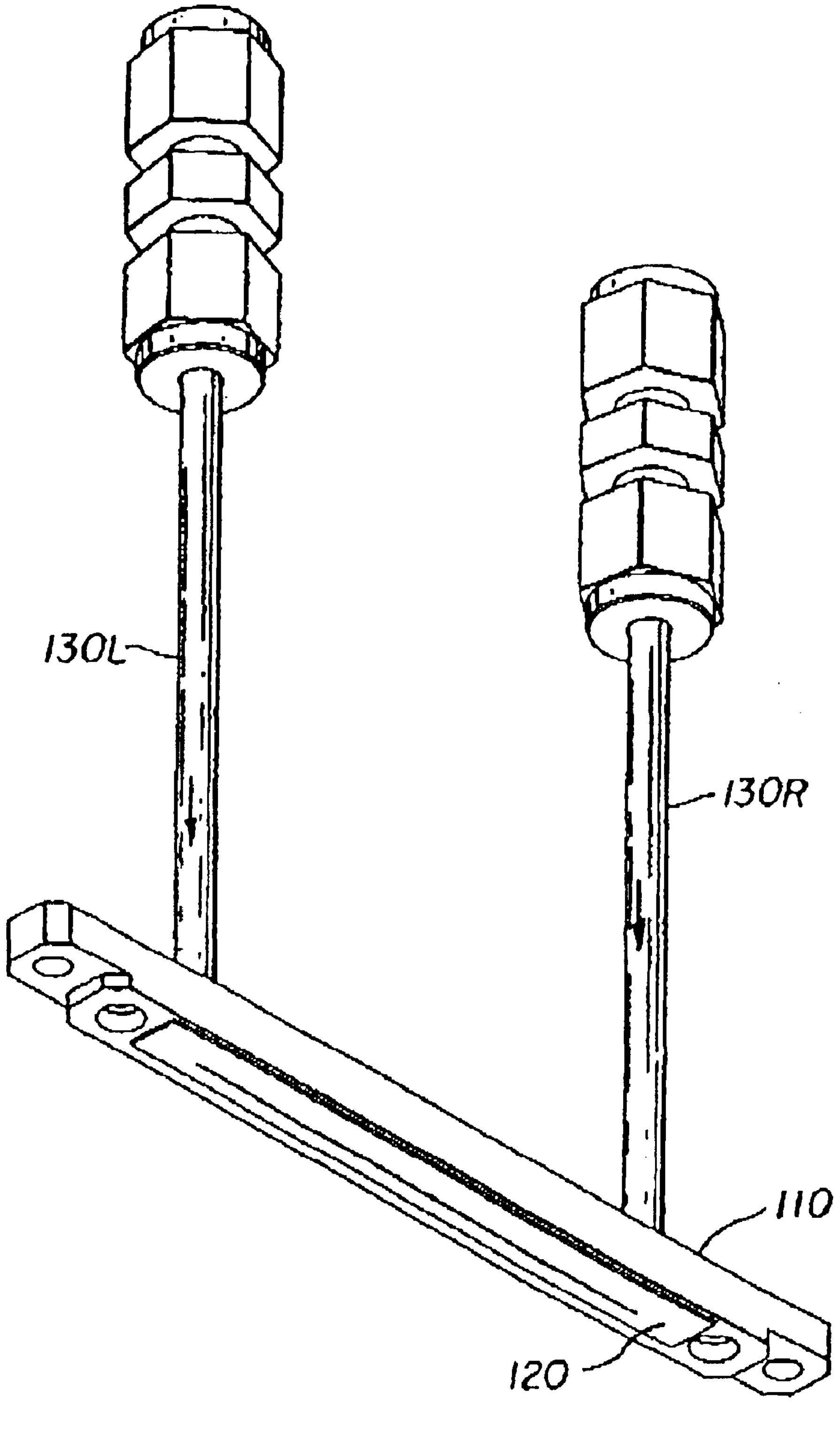
FIG. 14 is a perspective view of the CMOS/MEMS print head formed in accordance with the invention and mounted on a support substrate into which ink is delivered.
Figure 15:
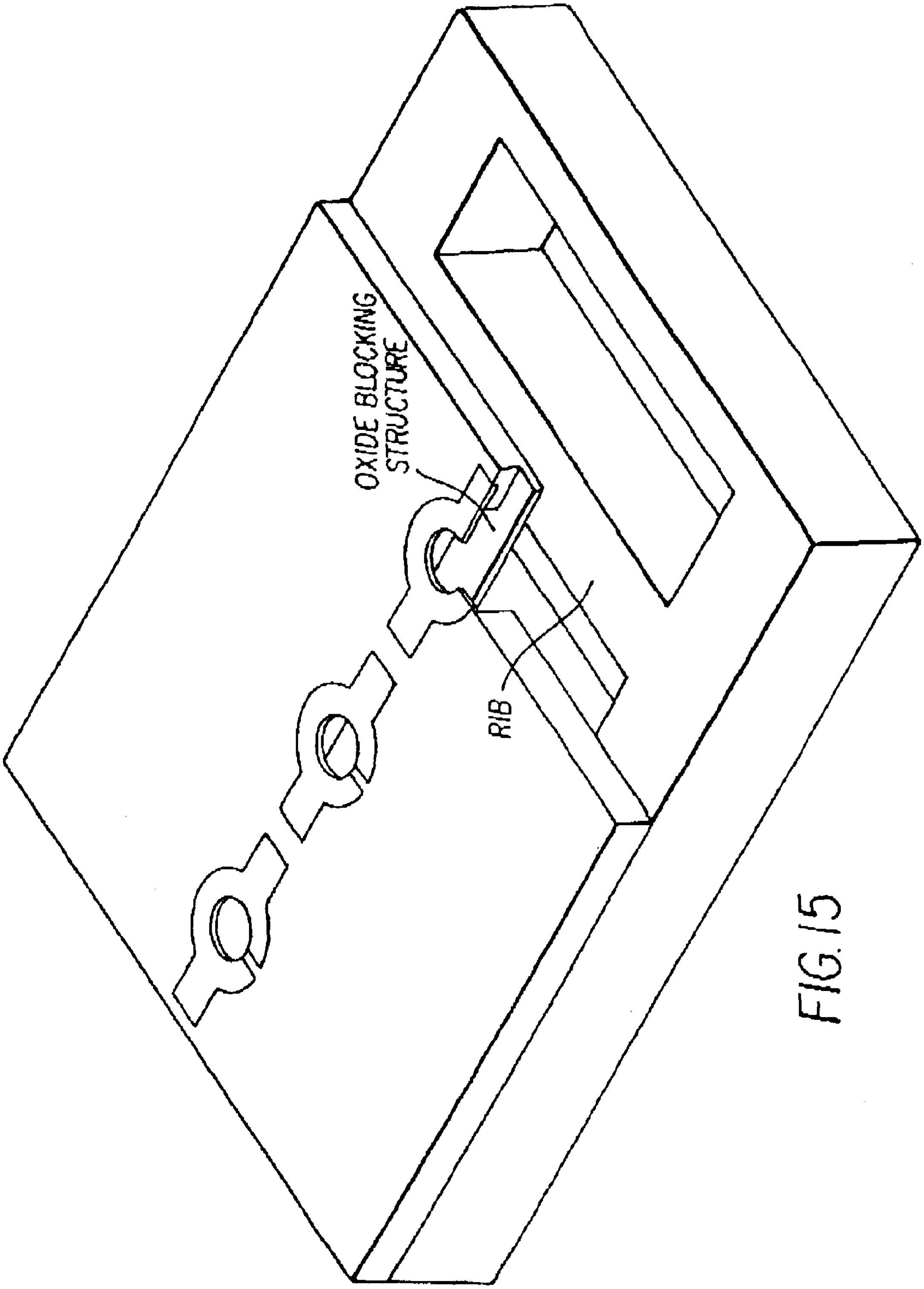
FIG. 15 is a perspective view of a portion of the CMOS/MEMS print head and illustrating a rib structure and an oxide blocking structure.
Figure 16:
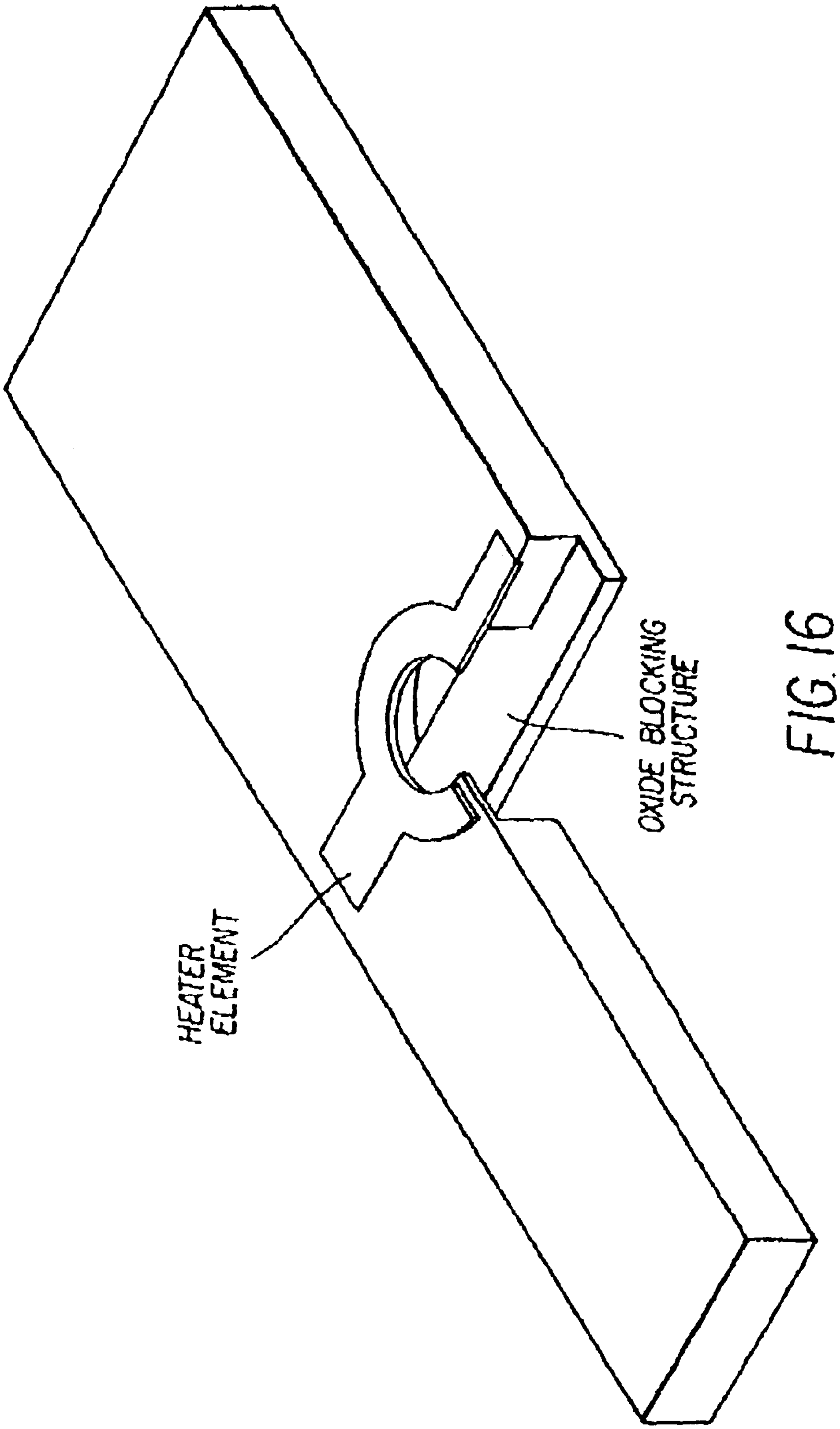
FIG. 16 is a perspective view illustrating a closer view of the oxide blocking structure.

With reference to FIG. 14 the completed CMOS/MEMS print head 120 is mounted on a supporting mount 110 having a pair of ink feed lines 130 L, 130R connected adjacent end portions of the mount for feeding ink to ends of a longitudinally extending channel formed in the supporting mount. The channel faces the rear of the print head 120 and is thus in communication with all the ink channels formed in the silicon substrate of the print head 120. The supporting mount, which could be a ceramic substrate includes mounting holes at the ends for attachment of this structure to a printer system.

Although the present invention has been described with particular reference to various preferred embodiments, the invention is not limited to the details thereof. Various substitutions and modifications will occur to those of ordinary skill in the art, and all such substitutions and modifications are intended to fall within the scope of the invention as defined in the appended claims.

What is claimed is:

1. A method of forming a continuous ink jet print head having a plurality of nozzles and a bore associated with each nozzle, the method comprising:

providing a silicon substrate having integrated circuits for controlling operation of the print head, the silicon substrate having an insulating layer or layers formed thereon, the insulating layer or layers having electrical conductors formed therein that are electrically connected to circuits formed in the silicon substrate;

forming in the insulating layer or layers a secondary ink channel and a blocking structure for controlling lateral flow of ink from a primary ink channel formed in the silicon substrate to a secondary ink channel formed in the insulating layer or layers;

forming a bore communicating with the secondary ink channel; and forming in the silicon substrate the primary ink channel communicating with the secondary ink channel.

2. The method of claim 1 and including the step of forming a heater element adjacent the bore and forming the bore with a passivation layer covering the heater element.

3. The method of claim 2 and including the step of forming a heater element in the insulating layer or layers within the blocking structure to provide a pre-heating element.

4. The method of claim 3 and including etching the insulating layer down to the silicon substrate to form the blocking structure.

5. The method of claim 4 and including filling an opening created by the etching step with a sacrificial layer; forming the passivation layer over the sacrificial layer that includes the heater element covered by the passivation layer; forming the bore in the passivation layer; and removing the sacrificial layer.

6. The method of claim 1 and including etching the insulating layer down to the silicon substrate to form the blocking structure.

7. The method of claim 6 and including filling an opening created by the etching step with a sacrificial layer; forming a passivation layer over the sacrificial layer that includes a heater element covered by the passivation layer; forming the bore in the passivation layer; and removing the sacrificial layer.

8. A method of forming a continuous ink jet print head having a plurality of nozzles and a bore associated with each nozzle, the method comprising:

providing a semiconductor substrate having integrated circuits for controlling operation of the print head, the substrate having an insulating layer or layers formed thereon, the insulating layer or layers having electrical conductors formed therein that are electrically connected to circuits formed in the substrate;

forming in the insulating layer or layers a secondary ink channel and a blocking structure for controlling lateral flow of ink from a primary ink channel formed in the substrate to a secondary ink channel formed in the insulating layer or layers;

forming a bore communicating with the secondary ink channel; and forming in the substrate the primary ink channel communicating with the secondary ink channel.

9. The method of claim 8 and including the step of forming a heater element adjacent the bore and forming the bore with a passivation layer covering the heater element.

10. The method of claim 9 and including the step of forming a heater element in the insulating layer or layers within the blocking structure to provide a pre-heating element.

11. The method of claim 8 and including etching the insulating layer down to the substrate to form the blocking structure.

12. The method of claim 11 and including filling an opening created by the etching step with a sacrificial layer; forming a passivation layer over the sacrificial layer that includes a heater element covered by the passivation layer; forming the bore in the passivation layer; and removing the sacrificial layer.

* * * * *